(12) United States Patent
Ayyapureddi

(10) Patent No.: US 12,367,913 B2
(45) Date of Patent: Jul. 22, 2025

(54) APPARATUSES, SYSTEMS, AND METHODS FOR MEMORY MODULE DATA DRIVERS

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 314 days.

(21) Appl. No.: 17/822,918

(22) Filed: Aug. 29, 2022

(65) Prior Publication Data

US 2022/0408886 A1    Dec. 29, 2022

(51) Int. Cl.
*G11C 7/10*  (2006.01)

(52) U.S. Cl.
CPC .......... *G11C 7/1072* (2013.01); *G11C 7/1066* (2013.01); *G11C 7/1093* (2013.01)

(58) Field of Classification Search
CPC .... G11C 7/1072; G11C 7/1066; G11C 7/1093
See application file for complete search history.

(56) References Cited

U.S. PATENT DOCUMENTS

| | | | |
|---|---|---|---|
| 5,796,672 A * | 8/1998 | Pitz | G11C 5/066 365/221 |
| 6,243,829 B1 | 6/2001 | Chan | |
| 7,134,069 B1 | 11/2006 | Longwell et al. | |
| 7,257,763 B1 | 8/2007 | Srinivasan et al. | |
| 7,487,428 B2 | 2/2009 | Co et al. | |
| 9,183,078 B1 | 11/2015 | Zhu et al. | |
| 10,635,531 B2 | 4/2020 | Cha et al. | |
| 10,725,841 B1 | 7/2020 | Rahul et al. | |
| 11,416,335 B2 | 8/2022 | Cho et al. | |
| 11,442,811 B1 | 9/2022 | Chung et al. | |
| 11,462,292 B1 | 10/2022 | Kim et al. | |
| 11,763,813 B2 | 9/2023 | Alon et al. | |
| 11,803,437 B1 | 10/2023 | Willey et al. | |
| 2005/0001653 A1* | 1/2005 | Ahmad | H03K 17/164 326/87 |
| 2008/0256281 A1* | 10/2008 | Fahr | G06F 13/16 710/305 |
| 2010/0005366 A1 | 1/2010 | Dell et al. | |
| 2011/0047427 A1* | 2/2011 | Bailey | G06F 11/2294 714/E11.155 |
| 2012/0287729 A1 | 11/2012 | Hirobe | |
| 2013/0007350 A1 | 1/2013 | D'Abreu et al. | |

(Continued)

OTHER PUBLICATIONS

Intel 6400/6402 Advanced Memory Buffer Datasheet, 250 pages, Oct. 2006.

(Continued)

*Primary Examiner* — Jay W. Radke
(74) *Attorney, Agent, or Firm* — Dorsey & Whitney LLP

(57) ABSTRACT

Apparatuses, systems, and methods for memory module data drives. A memory module includes a number of memory devices as well as module logic. Each memory device provides data by driving voltages along a data bus with a data bus driver of the memory device. An output driver, which is located on the module logic receives the voltages along the data bus and drives voltages of an external data terminal to output the data. The output driver may have a greater drive strength than the data bus driver.

19 Claims, 5 Drawing Sheets

(56) References Cited

U.S. PATENT DOCUMENTS

| | | |
|---|---|---|
| 2013/0305123 A1 | 11/2013 | Billing et al. |
| 2015/0378740 A1 | 12/2015 | Moyer et al. |
| 2019/0206840 A1* | 7/2019 | Lee .......................... G11C 5/04 |
| 2020/0278908 A1 | 9/2020 | Schaefer et al. |
| 2021/0050041 A1* | 2/2021 | Durai ............... G11C 29/50008 |
| 2023/0315565 A1 | 10/2023 | Sutera et al. |
| 2024/0070025 A1 | 2/2024 | Ayyapureddi |
| 2024/0071549 A1 | 2/2024 | Ayyapureddi |
| 2024/0071550 A1 | 2/2024 | Ayyapureddi |

OTHER PUBLICATIONS

U.S. Appl. No. 17/822,915 titled "Apparatuses, Systems, and Methods for Module Level Error Correction", filed Aug. 29, 2022—pp. all pages of the application as filed.

U.S. Appl. No. 17/822,909 titled, "Apparatuses, Systems, and Methods for Module Level Error Correction," filed Aug. 29, 2022—pp. all pages of the application as filed.

U.S. Appl. No. 17/822,912 titled, "Apparatuses, Systems, and Methods for Module Level Error Correction," filed Aug. 29, 2022—pp. all pages of the application as filed.

\* cited by examiner

APPARATUSES, SYSTEMS, AND METHODS FOR MEMORY MODULE DATA DRIVERS

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. During a read operation driver circuits may drive a voltage at an output terminal of the memory which represents a logical state of the read bits.

Multiple memory devices may be packaged together in a memory module. When a read operation is performed, multiple memory devices may be accessed and may provide data to external data terminals of the module. In a conventional memory module, each memory device may directly drive the output of the corresponding external data terminals. However, there may be an advantage to leveraging the packaging of multiple memory devices onto a single module.

DETAILED DESCRIPTION

Figure 1:
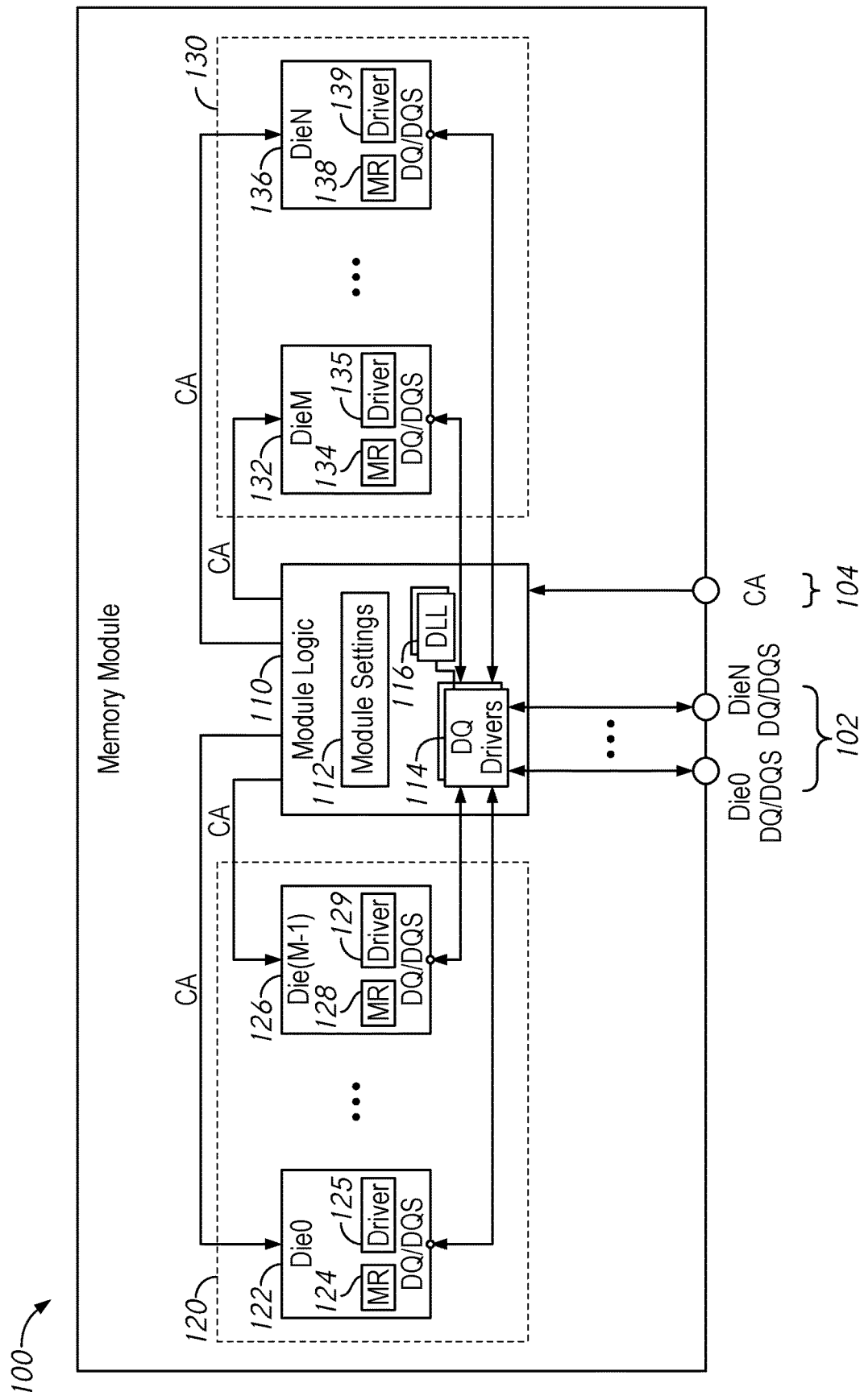
FIG. 1 is a block diagram of a memory module according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Multiple memory devices may be packaged together onto a memory module. For example, the module may have external connections such as external command/address (CA) terminals which couple the memories to a controller. The memories on the module may be grouped together into channels, and during an example access operation, data may be read from each of the memories of the channel. Each memory, may provide data bits in a mix of serial and parallel transmission over one or more output terminals of the memory. The memory may also provide a data clock, such as a data strobe signal, which indicates when data is available along the output terminals.

In a conventional memory, each memory may provide data bits as voltages along a data bus to external data terminals of the memory module. Each memory may include output drivers which drive a voltage of the external terminal to a voltage which represents the logical level of the output signal. The output drivers may also include serializer circuits which synchronize the provided data to an external clock signal (e.g., based on a delay circuit). In a memory module, such an arrangement may be inefficient, since the output circuitry may need to be replicated for each memory on the module. It may be useful to leverage the packaging of multiple memories onto a module to combine the output circuitry, for example to take advantage of components which can be shared between memories.

The present disclosure is directed to apparatuses, systems, and methods for memory module data drivers. Each memory device on a module includes a data bus which is coupled to a module logic circuit such as a data buffer. The module logic includes one or more output driver circuits. The module level output driver circuits may receive signals along the data bus and then drive external terminals of the module based on those signals. The memory devices may have relatively simple data bus drivers coupled to the data bus (e.g., inverters). The output driver on the module logic include a synchronizer circuit which matches the received data to a delayed clock signal provided by a delay circuit, an on-die termination (ODT) circuit, a pre-driver, and a final driver. In some embodiments, certain components, such as the delay circuit, may be shared between the data output drivers associated with multiple external data terminals and/or multiple memories of the device. In some embodiments, multiple memories (e.g., memories which share the same external data terminals) may use the same output driver circuits. In some embodiments, the module logic may include a module settings register, which may be used to set certain settings of the output driver. For example, the module settings register may be used to set a slew control or a drive strength of the ODT circuit.

FIG. 1 is a block diagram of a memory module according to some embodiments of the present disclosure. The memory module 100 is a device which packages together several memories (e.g., memory dice 122, 126, 132, and 136). Each memory includes a memory array which stores information. A controller (not shown) accesses one or more of the memories by passing commands and addresses along command and address (CA) terminals 104 and sends and receives data to/from one or more memories along external data terminals (DQ) 102. The module 100 includes module logic 110, which may include a buffer which acts to help routing of command, address, and/or data between the external terminals of the module (e.g., the CA terminals 104 and DQ terminals 102) and the corresponding terminal(s) of the memories. For example, each memory may have CA and DQ terminals, coupled to the external terminals through the module logic 110. The module logic 110 includes output (or DQ) drivers 114 which receive data signals from the accessed memory devices and then drive the external terminals 102 based on those internal signals.

The memories on the module 100 may be organized into channels. For example, the module 100 in FIG. 1 shows two channels 120 and 130. More or fewer channels per module may be used in other example embodiments. Each channel includes a number of memories. For example, the first channel 120 includes memories 0 to M−1, while the second channel 130 includes memories M to N. For the sake of brevity, only four memories, 122, 126, 132, and 136 are shown. In some example embodiments, there may be five memories per channel (e.g., M is 5 and N is 9). For the sake of consistency, five memories per channel will generally be used when example numbers are given herein. However, more or fewer memories per channel may be used in other example embodiments.

During an example access operation, the module 100 receives an access command and addresses along external CA terminals 104. The addresses may specify which channel should be accessed, as well as details about what memory cell(s) within the selected memories should be accessed. The module logic 110 routes the commands and addresses to the selected channel, and all of the memories of that channel may be accessed together.

The memories of the module may also be organized into ranks of memories which share the same external data terminals. For example, if each memory has N output terminals and N data bus lines coupling it to the module logic, then the module logic 110 may have N×M output terminals. A second rank (e.g., a second channel) may use those same N×M output terminals.

In some embodiments, there may be an output driver 114 for each external data terminal 102 (and each data bus line which is coupled to that external terminal). For example, if a channel has M memories and each provides N bits in parallel, then there may be at least N×M output driver circuits 114, one associated with each of N×M external data terminals 102. In some embodiments, output driver circuits 114 may be shared between memories of different ranks. For example, a given output driver circuit 114 associated with an may be used by both a memory device (e.g., 122) of a first rank, and also a memory device of a second rank which uses the same output terminal 102. In the example of FIG. 1, there are 2×N×M output terminals and output drivers 114, for each of the two channels 120 and 130. A second rank which shares the 2×N×M output, terminals 102 and output drivers 114 may be positioned on a back of the memory module chip 110 (not shown in FIG. 1).

The output driver circuits 114 may contain synchronizer circuits which may synchronize the data to a delayed clock signal provided by a delay circuit 116. The delayed clock signal may mimic a latency of the memory to ensure that the data arrives a specified number of clock cycles after the read command was received. For example, the delay circuit 116 may have an adjustable delay which is matched to the latency. In some embodiments, the delay circuits 116 may be shared by the output circuits 114 associated with a memory. In some embodiments, the delay circuits 116 may be shared between memory devices. For example, the delay circuits 116 may share based on distance from the module logic 110 (e.g., shared based on expected latency). For example, Die(M−1) 126 and DieM 132 may share a delay circuit 116, and Die0 and DieN may share a second delay circuit.

In an example read operation, each memory of a selected channel provides a codeword comprising a number of data bits from the memory cells specified by the address information at DQ terminals of the memory. The codewords are provided along internal data bus lines to the module logic 110. For example, data bus drivers 125, 129, 135, and 139 of the memories 122, 126, 132, and 136 respectively may drive voltages along the data bus lines based on the read data. The output drivers 114 of the module logic 110 drive the external data terminals 102 based on the signals along the internal data bus lines.

In an example write operation, the controller provides the codewords to the external DQ terminals 102 along with command and address information at the CA terminals 104 which indicates which memory cells the data in the codewords should be written to. The module logic 110 provides the codewords to the memories of the specified channel, and the codewords are written to the specified memory cells.

The module 100 has various external terminals, such as DQ terminals 102 and CA terminals 104. The module 100 may also have additional terminals not shown in FIG. 1, such as clock terminals, power terminals, sideband channels (e.g., alert pins) etc. The module 100 has a set of external DQ terminals 102 which may correspond to the DQ terminals on the memories. Each DQ terminal on a memory may be associated to an external DQ terminal 102. For example, if each memory has 16 DQ terminals, and there are 10 total memories (e.g., two channels of 5 memories each) in a rank then there may be 160 total external DQ terminals 102 and 160 output driver circuits 114. The second rank, which may include an additional 10 memories (organized in a third and fourth channel) may share the same 160 external data terminals and output driver circuits 114, 80 of which are shared by the first and the third channel and 80 of which are shared by the second and the fourth channel.

The module 100 includes a set of internal data buses which couple each memory's DQ pads to the module logic 110. The data buses include one or more conductive elements, and the voltage(s) along the data buses represent data being transmitted to/from the memory. For example, a first voltage may represent a high logical level, while a second voltage may represent a low logical level. In some embodiments, other arrangements may be used, for example, multi-level signaling where multiple bits are provided across a single signal line by using more than two voltages to represent the logical states of multiple bits. Similarly, in some embodiments, more data bus lines may be used than there are external terminals associated with that memory. In such embodiments, the output drivers 114 may include decoders to receive the data and split it into the appropriate number of outputs/

During an example read operation, the memory reads data from the memory array and drives voltages across the data bus. For example, data may be transmitted in a burst of multiple bits in series. The memory provides a data strobe clock (DQS) which indicates when different of the serial data bits may be latched along the data bus. For example, if the codeword includes 128 data bits, and there are S data bus lines for each memory's data bus, then a burst length of 16 serial bits along each data bus line may be used to transmit the codeword. The oscillations of the DQS signal indicate where the bits are in time along the data bus lines. For example, each rising and falling edge of DQS may indicate when a different bit is present along the lines of the data bus.

Since the distance between each memory die and the module logic 110 may be relatively short, relatively simple drivers may be used as the data bus drives to drive the voltages along the data bus lines. For example, a buffer circuit such as a pair of inverter circuits in series may be used to drive the voltages along the data bus lines. This drive strength may be below a specified drive strength of the memory module, as the output drivers 114 handle driving the data terminals 102 which are accessible to outside devices.

The module logic 110 includes a module settings register 112. The module settings register 112 may be a set of programmable registers which are used to set one or more values for the operation of the module 100. The module settings register 112 may act in a fashion analogous to the mode registers of the memories. Each memory may have a mode register, which includes a number of registers which store values related to the operation of the memory. For example, memory 122 includes mode register 124, memory 126 includes mode register 128, memory 132 includes mode register 134, and memory 136 includes mode register 138. The module settings register 112 (optionally in conjunction with the mode registers of the memories) may work to enable various settings of the module 100. For example, in some embodiments, the ECC circuit 114 may be a user selectable feature, and a register in the module settings register 112 may be used to disable the ECC circuit 114.

Figure 2:
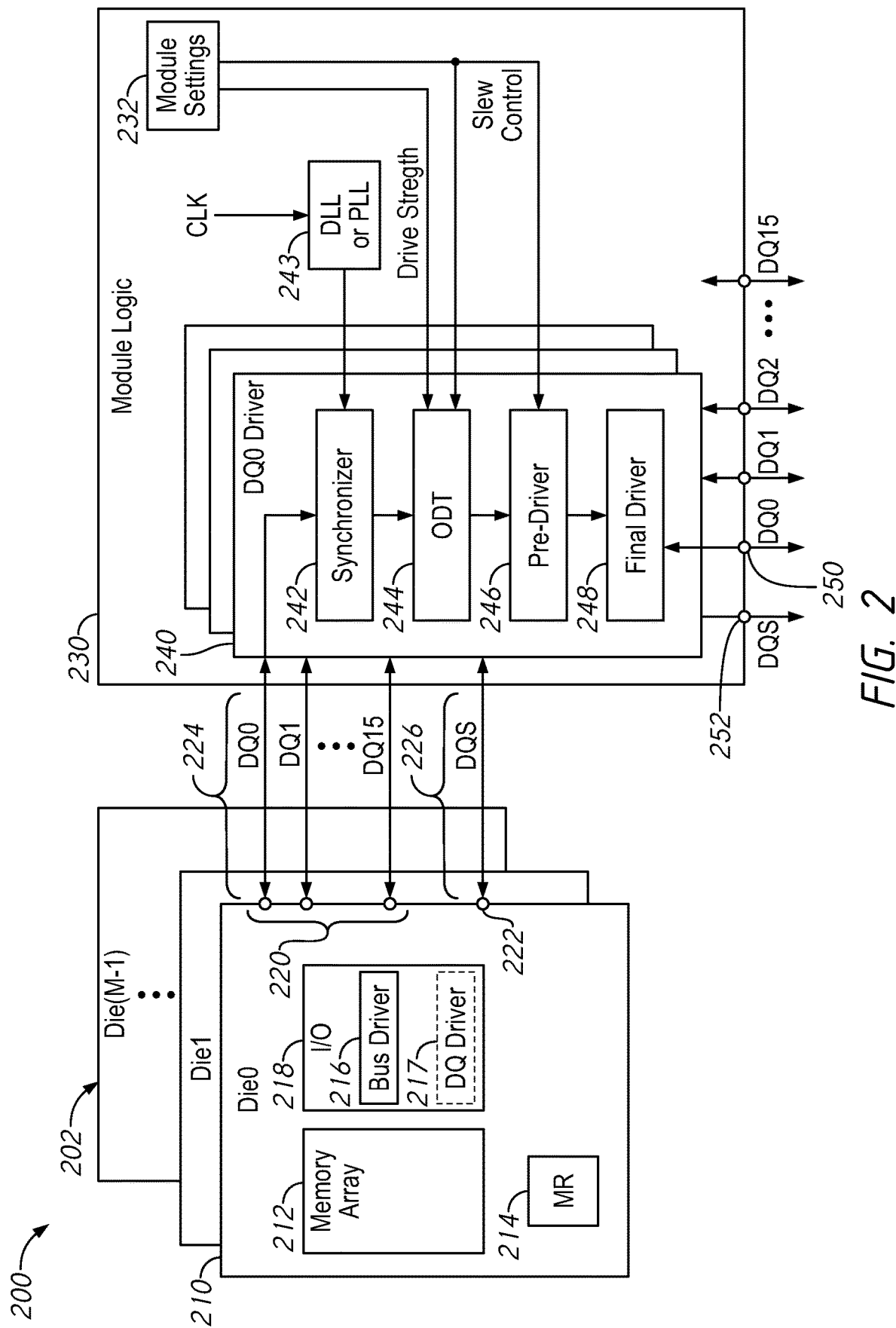
FIG. 2 is a block diagram of a memory module according to some embodiments of the present disclosure.

FIG. 2 is a block diagram of a memory module according to some embodiments of the present disclosure. The memory module 200 of FIG. 2 may, in some embodiments, represent components of the memory module 100 of FIG. 1. FIG. 2 highlights the interaction of a single channel 202 (e.g., channel 120 or 130 of FIG. 1), and specifically a single memory 210 within that channel with the output driver 240 of the module logic 230.

The memory module 200 includes a channel 202, which includes a set of M memory devices. The memories are coupled along data buses 224 to the module logic 230 (e.g., 110 of FIG. 1). Since the memory devices and their buses may be broadly similar to each other, only single memory 210 (e.g., 122 of FIG. 1) will be described in detail. The module logic 230 includes an output driver 240 (e.g., 114 of FIG. 1), In an example read operation, the memory 210 reads data from the memory array 212. An input/output (IO) circuit 218 of the memory 210 includes a data bus driver 216, which drives voltages along at the data terminals 220 of the memory, which in turn drives the voltages along the data bus 224. The TO circuit 218 also provides a data strobe clock signal DQS at a DQS terminal 222 and along a clock bus 226. The output driver 240 of the module logic drives voltages along external output terminals 250 of the module 200 based on the voltages along the data bus 224. The module logic 230 also provides the data strobe clock DQS at an external DQS terminal 252.

The channel 202 includes a set of M memory devices, such as memory device 210. The memory device 210 includes a memory array 212 which stores data bits in memory cells. The memory device 210 also includes an input/output (IO) circuit 218, which couples data to/from the memory array 212 and the memory's data terminals 220 and DQS terminal 222. The memory may include additional terminals (e.g., power terminals, clock terminals, CA terminals, etc.) not shown in FIG. 2. The memory 210 may also include a mode register 214 which may be used to manage various settings of the memory. For example, the mode register 214 may include settings which control how many data terminals 220 are used, a burst length along the data buses, etc. An example memory device is described in more detail in FIGS. 3.

The module logic 230 includes output driver circuits 240 which drives voltages along external data terminals during read operations. There may be sets of external data terminals corresponding to the number of data terminals on a memory device. For example, if memory 210 has 16 data terminals, then there may be 16 external data terminals in a set, and the module may have at least as many sets as there are memories in a channel. There may be a output driver circuit 240 for each external data terminal 250. The module 200 may have operational modes where less than all of the physical external data terminals are used (e.g., an x8 mode where 8 out of 16 terminals per memory are used or a x4 mode where 4 out of 16 terminals per memory are used). The module logic 230 also includes a module settings register 232, which stores various settings for the operation of the module 200, such as how many data terminals are used, how many data busses 224 are used, the strength at which the output driver 240 drives the external data terminals 250, etc.

The memory 210 is coupled to the module logic 230 along data buses 224. For the sake of brevity, only a single set of buses 224 are shown (corresponding to the memory 210), however there may be similar data buses 224 (and DQS buses 226) for each of the memories in the channel 202. Each data bus 224 may couple a data terminal 220 of the memory to the module logic 230. For example, there may be 16 DQ terminals 220 per memory, and thus 16 data bus lines 224 in a set. If there are five memories in the channel 202, there may be 80 total data bus lines per channel.

Data may be provided between the memory 210 and the module logic 230 in a serial format. The overall data bits of the codeword may be split among the data buses 224 and in parallel, but each data bus line may carry a set of bits in series in a burst. For example, if a burst length of 16 is used, then each data bus line may carry 16 bits in series. If a burst length of 8 is used, then each bus may carry 8 bits in series. For example, if the codeword includes 128 data bits per memory, then 16 data buses 224 and a burst length of 8 may be used. If 8 data buses 224 are used (e.g., as part of an x8 mode), then a burst length of 16 may be used. Other arrangements of data buses and burst lengths may be used in other example embodiments, and the number of data buses and the burst length may be selectable (e.g., based on settings in the mode register 214 of the memory 210 and/or buffer settings 232 of the module logic 230). The oscillations of the DQS signal may indicate where different bits in series are in time along the data bus 224. For example, DQS may be a periodic oscillating signal (e.g., a square wave) and each rising and falling edge of DQS may indicate a different bit along the data bus 224.

The output driver circuit 240 of the module logic 230 receives the data along the data bus 224 as voltages, and drives an output voltage of the external data terminals 250 based on those voltages. The output driver 240 may have a higher drive strength than the drive strength of the data bus driver 216 used by the memory 210. For example, a specification of the memory module may require certain voltages and certain drive strength. The data bus driver 216 may not be required to meet that specification, since they are only providing internal voltages over a relatively short distance, while the output driver 240 may meet the specification for providing data to external devices (e.g., a controller, not pictured). In some embodiments, the data bus driver 216 may be a relatively simple buffer circuit, such as one or more transistors. In some embodiments, there may be a data bus driver 216 for each data terminal 220 (and each data bus lines 224) that the memory is coupled to.

The module logic 230 may include a mix of circuits used on a per-external terminal 250 basis and components which are shared across multiple terminals and/or multiple memories. For example, the output circuits 240 may generally be repeated on a per-terminal bases, while the delay circuit 243 may generally be shared by all the output circuits 240 associated with a given memory (e.g., 210) and may in some embodiments also be shared by the output circuits 240 of multiple memories. Since the output circuits 240 may generally be similar to each other, only a single output circuit will be described in detail.

The output driver circuit 240 includes a synchronizer, which synchronizes the incoming data to a clock signal CLK based on a delay circuit 243 (e.g., 116 of FIG. 1). The delay circuit 243 may, for example, be a delay locked loop (DLL) or a phase locked loop (PLL). The delay circuit may have a variable amount of delay which mimics an amount of latency between the time a command such as a read command is received, and the time that the synchronizer circuit is provided. During an initialization process, the delay of the delay circuit 243 may be matched to an actual latency of the system. In some embodiments, the delay circuit 243 may be repeated on a per-memory basis. In some embodiments, the memories 210 may be divided into groups, and there may be a delay circuit 243 for each group. For example, the groups may be based on an expected latency. In some embodiments, the groups may be based on a distance that the memory device is from the module logic 230 on the chip.

The synchronizer 242 matches the received data (in this example along DQ0 from memory Die0) to the external clock signal CLK. The synchronized data is provided to an on-die termination (ODT) circuit 244, which matches an impedance of the data terminal 250 to the impedance along the external line. The termination strength of the ODT circuit 244 may be a setting in the module settings register 240. The ODT circuit 244 may also determine a drive strength of the voltage, which may also be a setting of the module settings register 240.

The ODT circuit 244 provides the signal to a pre-driver circuit 246 and the pre-driver circuit 246 provides the signal to a final driver circuit 248. The pre-driver 246 and final driver 248 drive a voltage at the data terminal 250 (and along the connection between the data terminal and an external device such as the controller). The ODT circuit 244 and/or the pre-driver circuit 246 may receive a slew control signal from the module settings register, which may determine a level of control to apply to the output signal.

In some embodiments, the module level output driver 240 may be an optional feature, and the memories 210 may also include optional output drivers. If the memory level output drivers 217 are enabled, then the output drivers 240 on the module logic 230 may be disabled and may simply pass the voltages provided by the memories. If the module level output drivers 240 are enabled, then the memory output drivers 217 may be disabled and the data bus drivers 216 may be used. The output drivers 217 may generally be similar to the output drivers 240.

Figure 3:
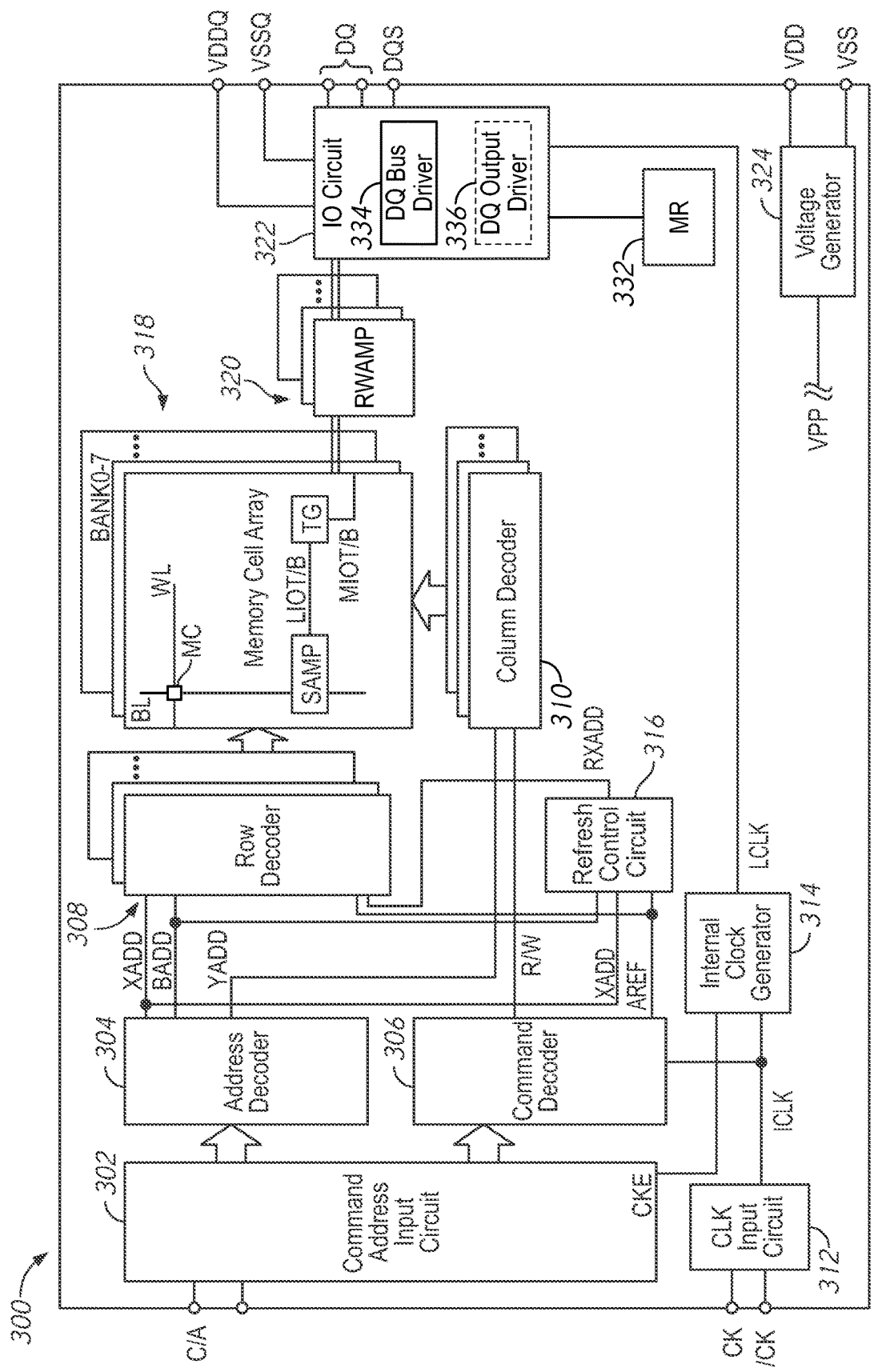
FIG. 3 is a block diagram of a semiconductor device according to some embodiments of the disclosure.

FIG. 3 is a block diagram of a semiconductor device according to some embodiments of the disclosure. The semiconductor device 300 may be a semiconductor memory device, such as a DRAM device integrated on a single semiconductor chip. The memory device 300 may, in some embodiments, implement the memory dies 122, 126, 132, and/or 136 of FIG. 1 and/or 210 of FIG. 2. The memory device 300 of FIG. 3 has various external terminals (e.g., data terminals DQ, data strobe clock DQS, command/address terminals, etc.) which may be coupled to buses within the module. Module logic of the module may send/receive information to an external controller and route signals along the buses to the terminals of the memory device 300.

The semiconductor device 300 includes a memory array 318. The memory array 318 is shown as including a plurality of memory banks. In the embodiment of FIG. 1, the memory array 318 is shown as including eight memory banks BANK0-BANK7. More or fewer banks may be included in the memory array 318 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 308 and the selection of the bit lines BL is performed by a column decoder 340. In the embodiment of FIG. 3, the row decoder 308 includes a respective row decoder for each memory bank and the column decoder 310 includes a respective column decoder for each memory bank. The bit lines BL are coupled to a respective sense amplifier (SAMP). Read data from the bit line BL is amplified by the sense amplifier SAMP, and transferred to IO circuits 322 through complementary local data lines (LIOT/B), transfer gate (TG), and complementary main data lines (MIOT/B) via read/write amplifiers (RWAMP) 320. Conversely, write data received by the IO circuit 322 over the data terminals DQ is transferred to the sense amplifier SAMP through the RWAMP 320 over the complementary main data lines MIOT/B, the transfer gate TG, and the complementary local data lines LIOT/B, and written in the memory cell MC coupled to the bit line BL.

The semiconductor device 300 may employ a plurality of external terminals that include command and address (C/A) terminals coupled to a command and address bus to receive commands and addresses, and a CS signal, clock terminals to receive clocks CK and /CK, data terminals DQ to provide data, data strobe clock terminals DQS to provide a data strobe signal DQS and power supply terminals to receive power supply potentials VDD, VSS, VDDQ, and VSSQ.

The clock terminals are supplied with external clocks CK and /CK that are provided to an input circuit 312. The external clocks may be complementary. The external clocks CK and/CK (e.g., clock signal CLK of FIG. 2) may be provided by a controller through the module logic. The input circuit 312 generates an internal clock ICLK based on the CK and/CK clocks. The ICLK clock is provided to the command decoder 306 and to an internal clock generator 314. The internal clock generator 314 provides various internal clocks LCLK based on the ICLK clock. The LCLK clocks may be used for timing operation of various internal circuits. The internal data clocks LCLK are provided to the input/output circuit 322 to time operation of circuits included in the input/output circuit 322, for example, to data receivers to time the receipt of write data. The DQS clock provided by the IO circuit 322 may be, or may be based on, the internal data clock LCLK The C/A terminals may be supplied with memory addresses. A controller may provide the addresses to CA terminals of the module (e.g., 100 of FIG. 1) and module logic (e.g., 110 of FIG. 1) may route that CA information to the CA terminals of the selected memory device. The memory addresses supplied to the C/A terminals are transferred, via a command/address input circuit 302, to an address decoder 304. The address decoder 304 receives the address and supplies a decoded row address XADD to the row decoder 308 and supplies a decoded column address YADD to the column decoder 310. The address decoder 304 may also supply a decoded bank address BADD, which may indicate the bank of the memory array 318 containing the decoded row address XADD and column address YADD. The C/A terminals may be supplied with commands, also through the memory module logic. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 306 via the command/address input circuit 302. The command decoder 306 includes circuits to decode the internal command signals to generate various internal signals and commands for performing operations. For example, the command decoder 306 may provide a row command signal to select a word line and a column command signal to select a bit line.

The device 300 may receive an access command which is a read command. When a read command is received, and a bank address, a row address and a column address are timely supplied with the read command, a codeword including data bits is read from memory cells in the memory array 318 corresponding to the row address and column address. The read command is received by the command decoder 306, which provides internal commands so that read data from the memory array 318 is provided to the IO circuit 322. The IO circuit 322 provides the read data bits to a data bus (e.g., 224 of FIG. 2) from DQ terminals of the device. The manner in which the IO circuit 322 provides the signals burst length, number of DQ terminals to use, binary or multi-level signaling, etc.) may be determined by a setting in a mode register 332. A data bus driver 334 of the IO circuit 322 may drive voltages along the data bus based on the data bits read from the memory array 318.

The device 300 may receive an access command which is a write command. When the write command is received, and a bank address, a row address, and a column address are timely supplied as part of the write operation, and write data is supplied through the DQ terminals to the IO circuit 322 along with parity data provided along the parity terminals PDQ. The write data and write parity bits is supplied to the data terminals DQ is written to a memory cells in the memory array 318 corresponding to the row address and column address. The write command is received by the command decoder 306, which provides internal commands so that the write data is received by data receivers in the input/output circuit 322. Write clocks may also be provided to the external clock terminals for timing the receipt of the write data by the data receivers of the input/output circuit 322.

The IO circuit 322 includes a data bus driver 334 (e.g., 129 of FIG. 1 and/or 216 of FIG. 2) which drives voltages along the data terminals DQ (and along the data bus such as 224 of FIG. 2) based on the signals read from the memory array. The data bus driver 334 may have a relatively low drive strength (e.g., below a drive strength required by the specification of the module). For example, the data bus driver 334 may include a buffer circuit, such as one or more inverters. An example set of data bus drivers is described in more detail in FIG. 4.

In some embodiments, the use of module level or memory level output drivers may be a selectable feature of the memory device. In such embodiments, the memory may include an optional set of output driver circuits 336. When the module level output drivers (e.g., 240 of FIG. 2) are enabled, for example by a setting of the module setting register 323, then the data bus driver circuit 334 may be enabled and the data output driver 336 may be disabled (e.g., by settings of the mode register 332). When the module level output drivers are disabled, then the data bus drivers 334 may be disabled, and the data output driver 336 may be enabled. In that situation the output drivers 336 may directly drive the external data terminals (e.g., 102 of FIG. 1 and/or 250 of FIG. 2) and the module logic may act as a pass-through.

In embodiments, where the output drivers 326 are included on the memory, the output drivers 336 may generally be similar to the module level output drivers. For example, similar to the output drivers 240 of FIG. 2, the output drivers 336 may include an ODT, pre-driver, and driver circuit. Instead of a synchronizer, the output drivers 326 may include a serializer circuit which may receive multiple bits in parallel and then provide them in a serial format. The serializer may also act to synchronize the data. For example, the memory may include a delay circuit (e.g., similar to the delay circuit 243 of FIG. 2) such as a DLL or PLL, which may provide a delayed clock signal based on a latency of the system. The serialized signal may then be passed through the ODT, pre-driver, and final driver. The output drivers 326 may have a greater driver strength than the data bus drivers 334.

The mode register 332 includes various settings, stored in registers. The different registers may be used for various features, such as to adjust the operation of the device 300, providing information about the operation of the device, enabling or disabling various features of the device 300 and so forth.

The device 300 may also receive commands causing it to carry out one or more refresh operations as part of a self-refresh mode. In some embodiments, the self-refresh mode command may be externally issued to the memory device 300. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 306 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 316. The refresh control circuit 316 supplies a refresh row address RXADD to the row decoder 308, which may refresh one or more wordlines WL indicated by the refresh row address RXADD.

The power supply terminals are supplied with power supply potentials VDD and VSS. The power supply potentials VDD and VSS are supplied to an internal voltage generator circuit 324. The internal voltage generator circuit 324 generates various internal potentials VPP, VOD, VARY, VPERI, and the like based on the power supply potentials VDD and VSS supplied to the power supply terminals. The internal potential VPP is mainly used in the row decoder 308, the internal potentials VOD and VARY are mainly used in the sense amplifiers SAMP included in the memory array 318, and the internal potential VPERI is used in many peripheral circuit blocks.

The power supply terminals are also supplied with power supply potentials VDDQ and VSSQ. The power supply potentials VDDQ and VSSQ are supplied to the input/output circuit 322. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 322 so that power supply noise generated by the input/output circuit 322 does not propagate to the other circuit blocks.

Figure 4:
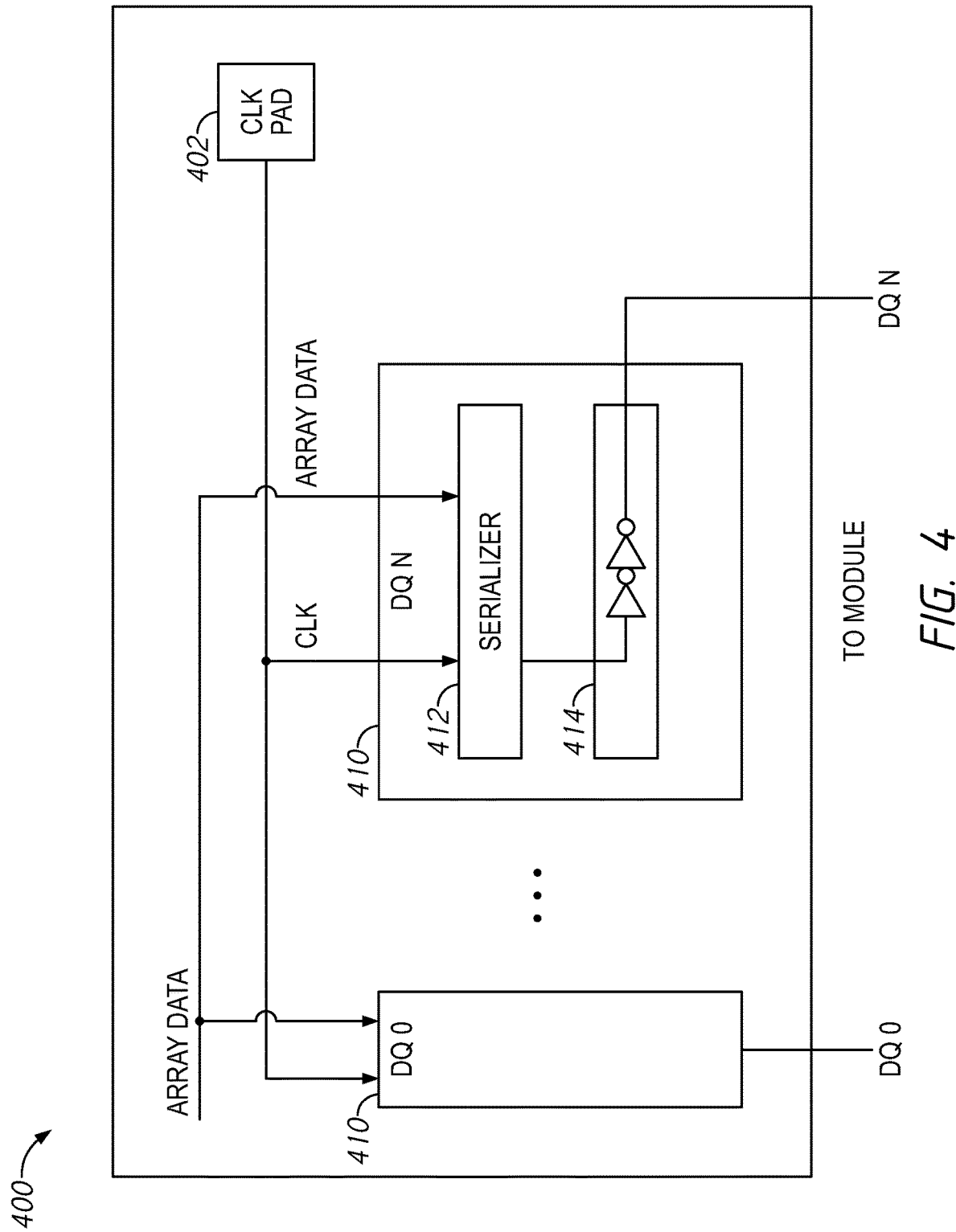
FIG. 4 is a block diagram of an input/output circuit of a memory device according to some embodiments of the present disclosure.

FIG. 4 is a block diagram of an input/output circuit of a memory device according to some embodiments of the present disclosure. The IO circuit 400 of FIG. 4 may, in some embodiments, be included in the IO circuit 218 of FIG. 2 and/or 322 of FIG. 3. The IO circuit includes a number of data bus driver circuits 410, each of which may implement the data bus driver circuit 125, 129, 135, and/or 139 of FIG. 1, 216 of FIG. 2, and/or 334 of FIG. 3.

The IO circuit 400 includes a number of data bus drivers 410, each of which is associated with an output terminal of the memory (e.g., with a data bus line). Since the data bus drivers 410 are generally similar, only one (for DQ N) is shown and described in detail. The data bus driver 410 includes a serializer 412, which receives multiple bits of data in parallel from the array and provides them in a serial format. The data may be serialized based on clock signal received a clock pad 402 of the IO circuit. For example, the data strobe clock DQS may be used to serialize the data. The serialized data may be used by a buffer circuit 414 to drive a signal along the data bus line. In some embodiments, the buffer circuit 414 may be a pair of inverter circuits in series with each other.

Figure 5:
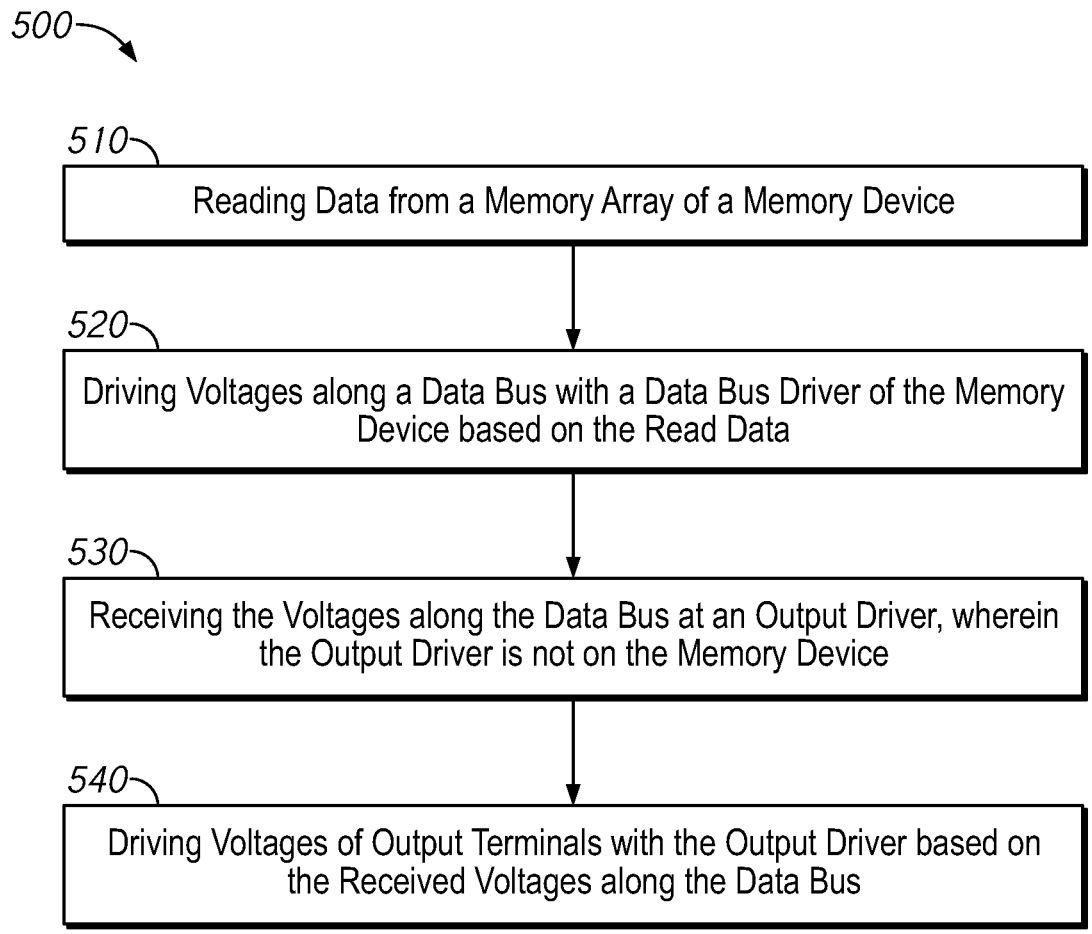
FIG. 5 is a flow chart of a method according to some embodiments of the current disclosure.

FIG. 5 is a flow chart of a method according to some embodiments of the current disclosure. The method 500 may, in some embodiments, be implemented on one or more of the apparatuses and/or systems described herein, such as the memory module 100 of FIG. 1 and/or 200 of FIG. 2.

The method 500 includes box 510, which describes reading data from a memory array of a memory device. For example, the method may include receiving a read command at a CA terminal (e.g., 104) of a memory module, and providing that read command to the memory device via a module logic circuit (e.g., 110 of FIG. 1 and/or 230 of FIG. 2).

Box 510 may generally be followed by box 520, which describes driving voltages along a data bus with a data bus driver of the memory device based on the read data. The data bus driver (e.g., 125 of FIG. 1, 216 of FIG. 2, 334 of FIG. 3 and/or 410 of FIG. 4) may receive the data along an internal data bus (e.g., MIOT/B) and drive voltages of an data terminal of the memory device (e.g., 220 of FIG. 2). The method 500 may include serializing the data with the data bus drive (e.g., with serializer 412 of FIG. 4).

Box 520 may generally be followed by box 530, which describes receiving voltages along the data bus at an output driver. The output driver (e.g., 114 of FIG. 1 and/or 240 of FIG. 2) may be located on a part of the memory module which is not on the memory device. For example the output driver may be part of the module logic circuit.

In some embodiments, the method 500 may include delaying a clock signal (e.g., with delay circuit 116 of FIG. 1 and/or 243 of FIG. 2) and synchronizing the received data along the data bus to the delayed clock signal (e.g., with synchronizer circuit 242 of FIG. 2). The delayed clock signal may be delayed for an amount of time to match a latency of the system, which may include a time it takes data to be received at the module logic. The delayed clock signal may be used by more than one output driver and/or by output drivers associated with different memory devices.

Block 530 may generally be followed by block 540, which describes driving voltages of output terminals with the output driver based on the received voltages along the data bus. The method 500 may include driving the voltages along the data bus with a first drive strength using the data bus drivers and driving the voltages along the output terminals with a second drive strength which is greater than the first drive strength. The second drive strength may conform to a specification of the memory module while the first drive strength may not. The method 500 may include setting the drive strength of the output driver based on a setting in a module settings register (e.g., 112 of FIG. 1 and/or 232 of FIG. 2). The method 500 may include receiving voltages along multiple data buses from multiple memory devices, and driving the voltages of the output terminals based on the data from the multiple memories.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   output terminals;
   a first memory device configured to provide data along a first data bus;
   a second memory device configured to provide data along a second data bus;
   module logic configured to receive the data from the first data bus and the second data bus, the module logic including output drivers configured to drive a voltage of the output terminals based on the received data from the first data bus and the second data bus, wherein the output drivers comprises a first output driver associated with the first memory device, the first output driver including a first synchronizer circuit; and
   a delay circuit configured to provide a delayed clock signal, wherein the first synchronization circuit is configured to synchronize the voltage to the delayed clock signal.

2. The apparatus of claim 1, wherein the output drivers are not on the first memory device or the second memory device.

3. The apparatus of claim 1, wherein the module logic includes module settings register, and wherein a drive strength of the output drivers is set based on a setting of the module settings register.

4. The apparatus of claim 1, wherein each of the output drivers includes a termination circuit.

5. The apparatus of claim 1, wherein the first memory device includes a first data bus driver, the second memory device includes a second data bus driver, and wherein a drive strength of the output drivers is greater than a drive strength of the first data bus driver or the second data bus driver.

6. An apparatus comprising:
output terminals;
a first memory device configured to provide data along a first data bus;
a second memory device configured to provide data along a second data bus;
module logic configured to receive the data from the first data bus and the second data bus, the module logic including output drivers configured to drive a voltage of the output terminals based on the received data from the first data bus and the second data bus,
wherein the output drivers include:
a first output driver associated with the first memory, the first output driver including a first synchronizer circuit; and
a second output driver associated with the second memory, the second output driver including a second synchronizer circuit,
the apparatus further comprising a delay circuit shared by the first synchronizer circuit and the second synchronizer circuit.

7. An apparatus comprising:
output terminals;
a first memory device configured to provide data along a first data bus;
a second memory device configured to provide data along a second data bus;
module logic configured to receive the data from the first data bus and the second data bus, the module logic including output drivers configured to drive a voltage of the output terminals based on the received data from the first data bus and the second data bus, wherein the first memory device includes a first data bus driver, the second memory device includes a second data bus driver, and wherein a drive strength of the output drivers is greater than a drive strength of the first data bus driver or the second data bus driver, wherein the first data bus driver includes a first serializer circuit and the second data bus driver includes a second serializer circuit.

8. An apparatus comprising:
a memory device comprising a data bus driver configured to drive a voltage along a data bus;
an output driver configured to receive the voltage along the data bus and drive a voltage of an external data terminal based on the voltage along the data bus, wherein the output driver is not located on the memory device; and
a delay circuit configured to provide a delayed clock signal, wherein the delay circuit is not located on the memory device, and wherein the output driver comprises a synchronizer circuit configured to synchronize the voltage along the data bus to the delayed clock signal.

9. The apparatus of claim 8, wherein the memory device and the output driver are packaged on a memory module.

10. The apparatus of claim 8, further comprising a second memory device comprising a second data bus driver configured to drive a second voltage along a second data bus wherein the second memory device and the first memory device are on a memory module; and
a second output driver configured to receive the second voltage along the second data bus and drive a voltage of a second output terminal based on the second voltage along the data bus, wherein the output driver is not located on the second memory device, and wherein the output driver and the second output driver are part of a module logic circuit of the memory module.

11. The apparatus of claim 8, wherein a drive strength of the output driver is greater than a drive strength of the data bus driver.

12. The apparatus of claim 8, further comprising a module settings register, wherein a drive strength of the output driver is determined by a setting of the module settings register.

13. The apparatus of claim 8, wherein the memory device is further configured to provide a data strobe clock signal, and wherein the data strobe clock signal is provided to an external data strobe terminal.

14. A method comprising:
reading data from a memory array of a memory device;
driving voltages along a data bus with a data bus driver of the memory device based on the read data;
receiving the voltages along the data bus at an output driver, wherein the output driver is not on the memory device;
driving voltages of output terminals with the output driver based on the received voltages along the data bus;
delaying a clock signal; and
synchronizing the voltages along the data bus to the delayed clock signal with the output driver.

15. The method of claim 14, further comprising:
driving the voltages along the data bus with a first drive strength; and
driving the voltages of the output terminals with a second drive strength greater than the first drive strength.

16. The method of claim 14, further comprising:
reading second data from a second memory array of a second memory device;
driving second voltages along a second data bus with a second data bus driver of the second memory device based on the second read data; and
receiving the voltages along the second data bus at a second output driver, wherein the second output driver is not on the second memory device.

17. The method of claim 16, further comprising:
synchronizing the second voltages along the second data bus to the delayed clock signal with the second output driver.

18. The method of claim 14, further comprising setting a drive strength of the output driver based on settings in a module settings register.

19. The method of claim 14, further comprising:
serializing the data with the data bus driver of the memory device.

* * * * *